US006903951B1

(12) United States Patent
James et al.

(10) Patent No.: US 6,903,951 B1
(45) Date of Patent: Jun. 7, 2005

(54) CONTENT ADDRESSABLE MEMORY (CAM) DEVICE DECODER CIRCUIT

(75) Inventors: David V. James, Palo Alto, CA (US); Jagadeesan Rajamanickam, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 98 days.

(21) Appl. No.: 10/286,198

(22) Filed: Oct. 31, 2002

Related U.S. Application Data

(60) Provisional application No. 60/343,973, filed on Dec. 27, 2001.

(51) Int. Cl.$^7$ .............................. G11C 15/00; G11C 7/00
(52) U.S. Cl. ................ 365/49; 365/230.06; 365/186.07
(58) Field of Search .............................. 365/49, 189.07, 365/230.03, 230.06

(56) References Cited

U.S. PATENT DOCUMENTS

| | | | | |
|---|---|---|---|---|
| 5,369,621 A | * | 11/1994 | Mason | 365/230.06 |
| 5,440,753 A | * | 8/1995 | Hou et al. | 711/108 |
| 5,668,772 A | * | 9/1997 | Hotta | 365/230.06 |
| 5,829,009 A | | 10/1998 | Frazier | |
| 6,205,530 B1 | | 3/2001 | Kang | |

* cited by examiner

*Primary Examiner*—Thong Q. Le
(74) *Attorney, Agent, or Firm*—Bradley T. Sako

(57) ABSTRACT

A decoder circuit (100) is disclosed that may include "string" decoders (102-0 and 102-1), a compare circuit (104) and an enable circuit (106). String decoders (102-0 and 102-1) may provide "one-hot" or "string" decoding. One-hot decoding may activate one pre-decode signal. String decoding may activate one or more pre-decode signals. A compare circuit (104) may receive at least two pre-decode signals from one string decoder (102-1) and compare such values to generate a comparison result CMP. An enable circuit may generate decoder output signals (DEC0–DEC(n–1)) according to a comparison result CMP.

20 Claims, 8 Drawing Sheets

| INx | EXPL | P7 | P6 | P5 | P4 | P3 | P2 | P1 | P0 |
|---|---|---|---|---|---|---|---|---|---|
| 0 | 0 | 0 | 0 | 0 | 0 | 0 | 0 | 0 | 1 |
| 1 | 0 | 0 | 0 | 0 | 0 | 0 | 0 | 1 | 0 |
| 2 | 0 | 0 | 0 | 0 | 0 | 0 | 1 | 0 | 0 |
| 3 | 0 | 0 | 0 | 0 | 0 | 1 | 0 | 0 | 0 |
| 4 | 0 | 0 | 0 | 0 | 1 | 0 | 0 | 0 | 0 |
| 5 | 0 | 0 | 0 | 1 | 0 | 0 | 0 | 0 | 0 |
| 6 | 0 | 0 | 1 | 0 | 0 | 0 | 0 | 0 | 0 |
| 7 | 0 | 1 | 0 | 0 | 0 | 0 | 0 | 0 | 0 |
| 0 | 1 | 1 | 1 | 1 | 1 | 1 | 1 | 1 | 1 |
| 1 | 1 | 1 | 1 | 1 | 1 | 1 | 1 | 1 | 0 |
| 2 | 1 | 1 | 1 | 1 | 1 | 1 | 1 | 0 | 0 |
| 3 | 1 | 1 | 1 | 1 | 1 | 1 | 0 | 0 | 0 |
| 4 | 1 | 1 | 1 | 1 | 1 | 0 | 0 | 0 | 0 |
| 5 | 1 | 1 | 1 | 1 | 0 | 0 | 0 | 0 | 0 |
| 6 | 1 | 1 | 1 | 0 | 0 | 0 | 0 | 0 | 0 |
| 7 | 1 | 1 | 0 | 0 | 0 | 0 | 0 | 0 | 0 |

| EXPL | A2 | A1 | A0 | SD7 | SD6 | SD5 | SD4 | SD3 | SD2 | SD1 | SD0 |
|---|---|---|---|---|---|---|---|---|---|---|---|
| 0 | 0/1 | 0/1 | 0/1 | 1 | 1 | 1 | 1 | 1 | 1 | 1 | 1 |
| 1 | 1 | 1 | 1 | 0 | 0 | 0 | 0 | 0 | 0 | 0 | 0 |
| 1 | 1 | 1 | 0 | 0 | 0 | 0 | 0 | 0 | 0 | 0 | 1 |
| 1 | 1 | 0 | 1 | 0 | 0 | 0 | 0 | 0 | 0 | 1 | 1 |
| 1 | 1 | 0 | 0 | 0 | 0 | 0 | 0 | 0 | 1 | 1 | 1 |
| 1 | 0 | 1 | 1 | 0 | 0 | 0 | 0 | 1 | 1 | 1 | 1 |
| 1 | 0 | 1 | 0 | 0 | 0 | 0 | 1 | 1 | 1 | 1 | 1 |
| 1 | 0 | 0 | 1 | 0 | 0 | 1 | 1 | 1 | 1 | 1 | 1 |
| 1 | 0 | 0 | 0 | 0 | 1 | 1 | 1 | 1 | 1 | 1 | 1 |

| A2 | A1 | A0 | SD7 | SD6 | SD5 | SD4 | SD3 | SD2 | SD1 | SD0 |
|----|----|----|-----|-----|-----|-----|-----|-----|-----|-----|
| 1  | 1  | 1  | 1   | 1   | 1   | 1   | 1   | 1   | 1   | 0   |
| 1  | 1  | 0  | 1   | 1   | 1   | 1   | 1   | 1   | 0   | 1   |
| 1  | 0  | 1  | 1   | 1   | 1   | 1   | 1   | 0   | 1   | 1   |
| 1  | 0  | 0  | 1   | 1   | 1   | 1   | 0   | 1   | 1   | 1   |
| 0  | 1  | 1  | 1   | 1   | 1   | 0   | 1   | 1   | 1   | 1   |
| 0  | 1  | 0  | 1   | 1   | 0   | 1   | 1   | 1   | 1   | 1   |
| 0  | 0  | 1  | 1   | 0   | 1   | 1   | 1   | 1   | 1   | 1   |
| 0  | 0  | 0  | 0   | 1   | 1   | 1   | 1   | 1   | 1   | 1   |

CONTENT ADDRESSABLE MEMORY (CAM) DEVICE DECODER CIRCUIT

This application claims the benefit of provisional application Ser. No. 60/343,973 filed Dec. 27, 2001.

TECHNICAL FIELD

The present invention relates generally to decoder circuits, and more particularly to decoder circuits in content addressable memory (CAM) devices.

BACKGROUND OF THE INVENTION

Due to the increasing need for rapid matching capabilities, in networking hardware equipment for example, content addressable memories (CAMs) continue to proliferate. A CAM may perform matching functions by applying a search key or "comparand" to a table of stored data values. A CAM may then determine if any of the data values match a given search key.

CAM devices may take a variety of forms. As but a few of the possible examples, some CAM devices are based on particular types of CAM cells. Such cells may include storage circuits integrated with compare circuits. Examples of storage circuits may be static random access memory (SRAM) type cells or dynamic RAM (DRAM) type cells. Alternate approaches may include RAM arrays, or the like, with separate matching circuits and/or matching processes executed by a processor, or the like.

Conventional CAM devices may include both binary and ternary CAM devices. Binary CAM devices can provide a bit-by-bit comparison between a stored data value and a search key. Ternary CAM devices can provide maskable compare operations that can selectively exclude predetermined bits of a data value from a compare operation.

Typically, a conventional CAM device can generate match indications for each entry. That is, each entry can be compared with an applied search key value. If a search key value matches a stored data value, a match (or "hit") indication may be generated for the entry. Conversely, if a search key value does not match a stored data value, a mismatch (or "miss") indication may be generated for the entry.

Match results in a CAM device may include single match results, that can be generated when a single entry matches an applied key value, as well as multiple match results, that may be generated when more than one entry matches an applied key value.

While CAM entries can provide the above described match or search function, CAM entries may also include conventional data access functions, such as read or write operations, to read or write the data values that are compared to a search key.

Decoder circuits within CAM devices can conventionally select a CAM entry for a particular operation, such as a read or write. More specifically, conventional circuits may enable a particular CAM entry by coupling such a CAM entry to bit lines, or the like, so that data may be read from the entry or written into the entry. Mask data or similar data may be written for a given CAM entry in a similar fashion.

Conventional CAM decoder circuits can be conceptualized as being "one-hot" type decoders. That is, a typical conventional CAM decoder can receive a binary input value of N bits and output $2^N$ pre-decode output values. In response to each particular input value, one of the pre-decoder output values can be activated.

While one-hot type decoders can be suitable for read and write operations in a CAM device, it may be desirable to employ decoders that can provide more advanced functions in order to provide additional features in a CAM device.

SUMMARY OF INVENTION

According to the present invention, a decoder circuit may include a first string decoder that activates a different first pre-decode signal in response to different first input data values in a first mode. In a second mode, a first string decoder can activate different numbers of the first pre-decode signals in response to each different first input data value.

According to one aspect of the embodiments, a decoder circuit may also include a first compare circuit that compares two or more of the first pre-decode signals to generate a first comparison result.

According to another aspect of the embodiments, a decoder circuit may also include first pre-decode signals that have an order with respect to one another. A first compare circuit can generate one comparison result when a lower order first pre-decode signal is active and a higher order first pre-decode signal is inactive, and generates another first comparison result when the lower order first pre-decode signal and higher order first pre-decode signal are both active.

According to another aspect of the embodiments, a decoder circuit may also include an enable circuit. In response to one first comparison result from a first comparator, an enable circuit can generate decoder output signals according to second pre-decode signals. In response to another first comparison result from the first comparator, an enable circuit can generate predetermined decoder output signals.

In one particular approach, an enable circuit may include a first set of gates that are enabled in response to one first comparison result. An enable circuit may also include a second set of gates having inputs coupled to the outputs of the first set of gates. Such a set of gates can be enabled in response to another first comparison result.

According to another aspect of the embodiments, a decoder circuit may also include a second string decoder that activates a different second pre-decode signal in response to different second input data values in a first mode. In a second mode, a second string decoder may activate a different number of the second pre-decode signals in response to each different second data value. In addition, a second compare circuit can compare at least two of the second pre-decode signals to generate a second comparison result.

According to another aspect of the embodiments, in a decoder circuit, a second comparison result can be provided to a first compare circuit.

According to another aspect of the embodiments, a second compare circuit can logically combine a first comparison result with a second comparison result.

According to another aspect of the embodiments, a decoder circuit can include a number of content addressable memory (CAM) entries arranged into groups of size N, a number of first compare circuits, and a number of second compare circuits. In a second mode of operation, first compare circuits can compare at least two of the first pre-decode signals to generate first comparison results that each enable a CAM entry group. Further, second compare circuits can compare at least two second pre-decode signals to generate second comparison results. Second comparison results can enable entries within a same CAM entry group.

According to another aspect of the embodiments, a decoder circuit can further include a number of CAM entries formed in a first area of a substrate and a number of first compare circuits formed in a second area of the substrate adjacent to the first area. Further, a first string decoder can be formed in a third area of the substrate that is different than the second area.

The present invention may also include a method of activating decoder signals in a content addressable memory (CAM) device. Such a method may include activating one of a number of first pre-decode signals in response to different first input values in a first mode, and activating a different number of the first pre-decode signals in response to each different first input value in a second mode.

According to one aspect of the embodiments, a method may include the first pre-decode signals having an order with respect to one another. In addition, activating a different number of the first pre-decode signals can include activating a sequential number of the first pre-decode signals according to the order.

According to another aspect of the embodiments, a method may include accessing a single CAM entry in a first mode, and searching a predetermined number of CAM entries according to first input values in a second mode.

According to another aspect of the embodiments, a method may include activating a different number of second pre-decode signals in response to each different second input value in a second mode.

According to another aspect of the embodiments, a method may include comparing second pre-decode signals to enable one of a plurality of decoder output signal groups in response to different second input values in a first mode. In addition, in a second mode, comparing second pre-decode signals to enable a different number of the output signal groups in response to each different second input values.

According to another aspect of the embodiments, a method may include activating decoder output signals from one of the output signal groups according to the first pre-decode signals in both a first and second mode.

According to another aspect of the embodiments, a method may include the first pre-decode signals having a significance with respect to one another. A method may also include, in a second mode, in response to a particular first input value, activating all first pre-decode signals having greater significance than one first pre-decode signal activated in response to the same first input value in the first mode.

The present invention may also include an address decoder circuit that includes one or more circuits having at least two modes of operation. A first mode can produce a single active output signal for each possible input state combination. A second mode can produce multiple active output signals for each possible input state combination.

According to one aspect of the embodiments, multiple active output signals in a second mode are consecutive and range from the lowest order output signal to the same output signal as the single active signal in the first mode.

DETAILED DESCRIPTION OF THE EMBODIMENTS

Various embodiments of the present invention will now be discussed in conjunction with a number of figures. The embodiments describe a decoder apparatus and method that may be included in a CAM device. A decoder apparatus and/or method according to the present invention may provide conventional one-hot decoding in a first mode, but also provide "string" decoding in a second mode. String decoding may activate a different number of pre-decode signals in response to each different input value.

Figures 1, 2:
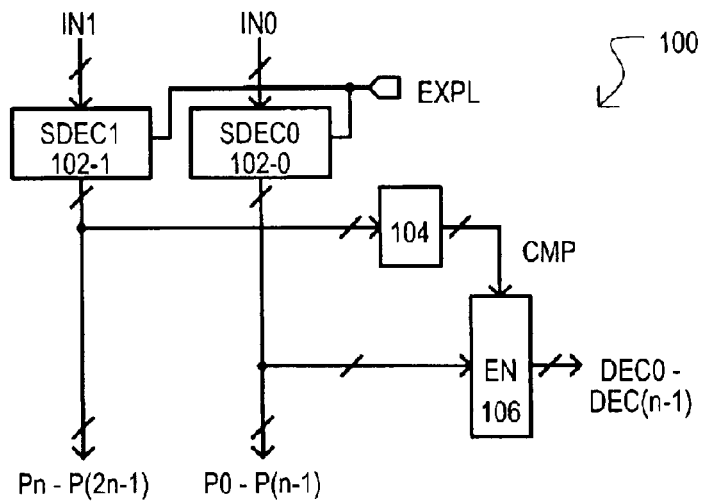
FIG. 1 is a block schematic diagram of a decoder circuit according to a first embodiment.
FIG. 2 is a table showing the operation of a "string" decoder according to the present invention.

Referring now to FIG. 1, a decoder circuit according to one embodiment is set forth in a block schematic diagram and designated by the general reference character 100. A decoder circuit may include "string" decoders 102-0 and 102-1. A decoder circuit 100 may also include a compare circuit 104 and an enable circuit 106.

Each string decoder (102-0 and 102-1) may receive an input value (IN0 or IN1) and provide corresponding pre-decode output signals (P0–P(n−1) or Pn–P(2n−1)). In the embodiment of FIG. 1, each string decoder (102-0 and 102-1) may also receive a mode signal EXPL. In response to a mode signal EXPL, a string decoder (102-0 and 102-1) may provide one-hot or string decoding. Particular examples of such decoding will be described in more detail below.

A compare circuit 104 may receive at least two pre-decode signals from one string decoder 102-1 and compare such values to generate a comparison result CMP. A comparison result CMP may be provided to an enable circuit 106.

An enable circuit 106 may receive pre-decode signals from one string decoder 102-0, and provide decoder output signals DEC0–DEC(n−1). The generation of decoder output signals (DEC0–DEC(n−1)) by an enable circuit 106 can be controlled by a comparison result CMP. As but one example, if a comparison result has one particular value, decoder output signals (DEC0–DEC(n−1)) may be generated in response to received pre-decode signals (P0 to P(n−1)). However, if a comparison result has another particular value, decoder output signals (DEC0–DEC(n−1)) may be predetermined values (e.g., all active and/or all inactive).

Referring now to FIG. 2, one example of a string decoder operation is set forth in table form. The table of FIG. 2 includes columns INx, EXPL, and P7–P0. A column INx can represent a received input value. In the very particular example of FIG. 2, an input value can range from 0–7.

A column EXPL shows a mode signal that can determine a mode of operation for a string decoder. A mode value EXPL of "0" can indicate a conventional (e.g., one-hot) mode of operation for a string decoder. Such a mode may include writes and reads to single entries in a memory device, such as a CAM device. In contrast, a mode value EXPL of "1" can indicate an unconventional (e.g., one or more hot) mode of operation for a string decoder. Such a mode may include an "explore" operation in a CAM device that may restrict a search operation to less than all available CAM entries.

Particular examples of explore operations (also referred to as restricted search and/or search-beyond operations) are set forth in co-pending U.S. patent application Ser. No. 10/281,814 filed on Oct. 28, 2002 and entitled "METHOD AND APPARATUS FOR RESTRICTED SEARCH OPERATION IN CONTENT ADDRESSABLE MEMORY (CAM) DEVICES" by James et al. The contents of this application are incorporated by reference herein.

As can be seen in FIG. 2, when a mode signal has a value of 0 (a one-hot mode), a string decoder may function in the same general fashion as a conventional decoder, activating a different pre-decode signal (P7–P0) in response to each different input value INx.

Unlike a conventional decoder, when a mode signal has a value of 1 (a string mode), a string decoder may activate different "strings" of values. More particularly, in FIG. 2, in response to each different input value, a string decoder may activate a different number of pre-decode signal (P7–P0) in response to each different input value INx.

In the very particular case of FIG. 2, in a string-hot mode, a string decoder may activate the same pre-decode signal as in the one-hot mode, but may also activate all pre-decode signals of higher significance. Thus, as shown in FIG. 2, when a mode signal EXPL is a "0", a string decoder may activate pre-decode signal P4 in response to an input value INx of "4". However, when a mode signal EXPL is a "1", a string decoder may activate pre-decode signal P4, and in addition, higher significant pre-decode signals P5–P7 in response to an input value of "4".

Looked at in another way, pre-decode signals may be conceptualized as having an order with respect to one another, in this case, a numerical order. In a one-hot mode a single pre-decode signal may be activated. However, in a string mode, multiple pre-decode signals may be activated in a consecutive order. In addition, a lowest signal in such an order may be the same signal that is activated in the one-hot mode.

Figure 3:
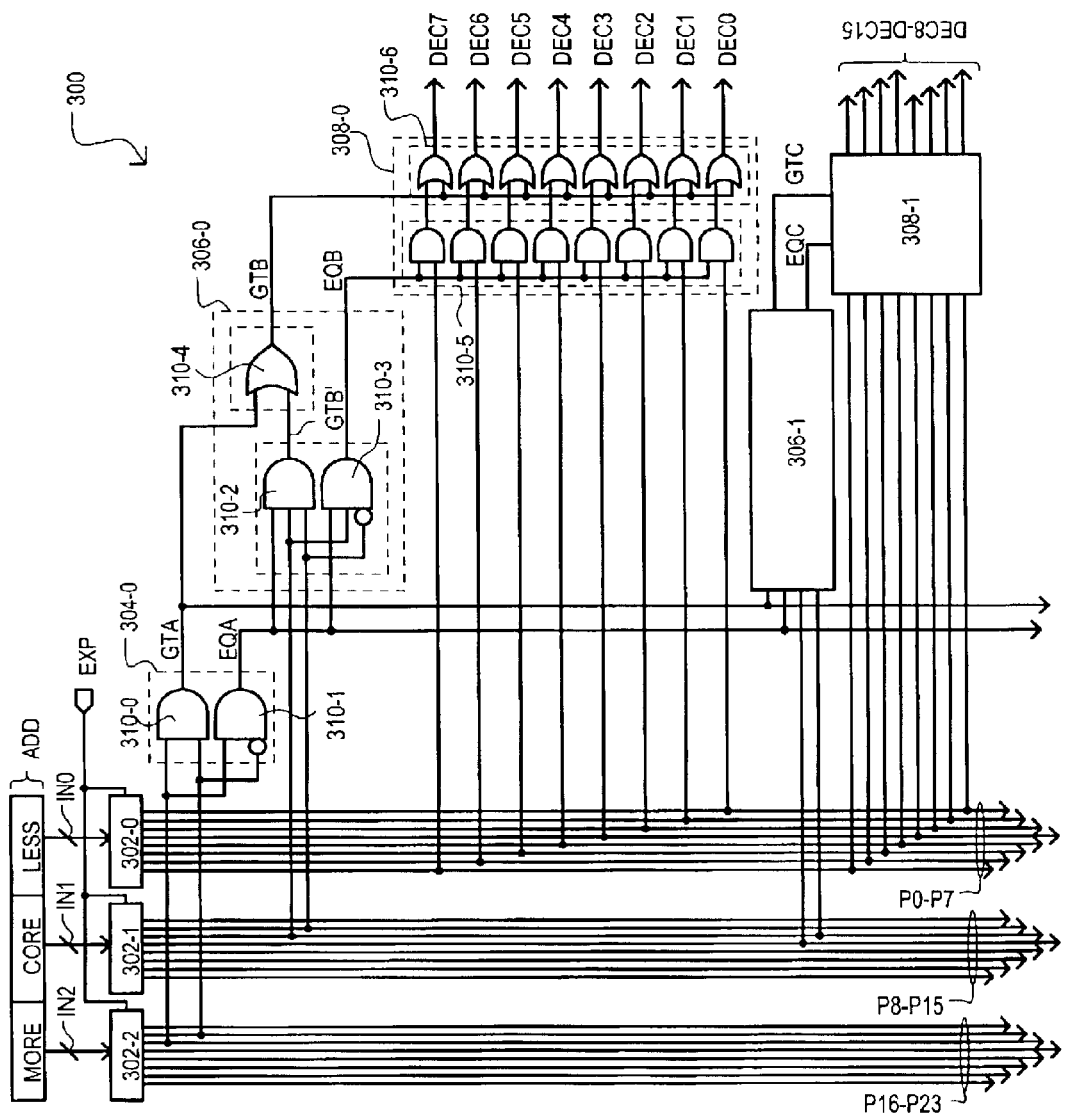
FIG. 3 is a block schematic diagram of a decoder circuit according to a second embodiment.

A decoder circuit according to a second embodiment will now be described with reference to FIG. 3. FIG. 3 shows a decoder circuit, designated by the general reference character 300, that includes string decoders 302-0 to 302-2, higher order compare circuit 304-0, lower order compare circuits 306-0 and 306-1, and enable circuits 308-0 and 308-1. The example of FIG. 3 shows an example of 3-bit encoding, in that an output of each string decoder (302-0 to 302-2) may be generated from a 3-bit encoded value.

String decoders (302-0 to 302-2) may receive an input address ADD, and in response thereto, generate pre-decode signals P0–P23. FIG. 3 shows string decoders (302-0 to 302-2) arranged to enable hierarchical string decoding. Such an arrangement may allow for an enabling or disabling of different numbers of decoder output signal groups in response to each different higher order address portion. Thus, in FIG. 3, an address may include multiple portions having a significance with respect to one another. Such portions are shown as "MORE", "CORE" and "LESS". A lowest significance portion LESS may be provided as an input value IN0 to a string decoder 302-0. A next significant portion CORE may be provided as an input value IN1 to a string decoder 302-1. An even higher significance portion MORE may be provided as an input value IN2 to a string decoder 302-2.

String decoders (302-0 to 302-2) may each operate in the same general fashion as shown in FIG. 2. Thus, string decoder 302-0 may activate one of pre-decode signals P0–P7 in a one-hot mode. However, in a string mode, a string decoder 302-0 may activate one to eight pre-decode signals P0–P7 depending upon a particular input value IN0. Similarly, string decoder 302-1 may activate one of pre-decode signals P8–P15 in a one-hot mode, and activate one to eight pre-decode signals P8–P15 in a string hot mode depending upon a particular input value IN1. In the same general fashion, string decoder 302-2 may activate one, to one to eight of pre-decode signals P16–P23, according to a mode.

A higher order compare circuit 304-0 may compare predetermined higher order pre-decode signals (in this case P16–P23) and provide such comparison results to lower order compare circuits (304-0 and 304-1). In one particular approach, a higher order compare circuit 304-0 may receive multiple pre-decode signals and determine if one such pre-decode signal is active, or if multiple such pre-decode signals are active. In the very particular example of FIG. 3, higher order compare circuit 304-0 may receive two pre-decode signals. If one particular pre-decode signal is active and the other is not, one comparison result GTA may be activated. However, if both pre-decode signals are active, another comparison result EQA may be activated.

In the very particular example of FIG. 3, a higher order compare circuit 304-0 may include a first gate 310-0 that can generate one compare result GTA, and second gate 310-1 that can generate another compare result EQA. Of course, while FIG. 3 shows a gate 310-0 as an AND gate and gate 310-1 as an AND gate with an inverting input, alternative logic may be employed to generate a same or similar result. Accordingly, the particular logic gate arrangement for higher order compare circuit 304-0 in FIG. 3 should not be construed as limiting the invention thereto.

In FIG. 3, higher order compare result GTA can be conceptualized as a "greater than" address result. Such a "greater than" address result can indicate that an address corresponding to a collection of decoder output signals is greater than a received address value. Thus, all such decoder outputs can be activated in a second mode or deactivated in a first mode.

In contrast, higher order compare result EQA can be conceptualized as an "equal to" address result. Such an "equal to" address result can indicate that one of decoder output signals in a collection of decoder signals has an address equal to a received address. Thus, groups within such a collection of decoder signals may be selectively activated according to lower order pre-decode signals (e.g., P8–P15).

Lower order compare circuits 306-0 and 306-1 may compare predetermined lower other pre-decode signals (in this case P8–P15) and provide such comparison results to corresponding enable circuits 308-0 and 308-1. Thus, in FIG. 3, lower order compare circuit 306-0 can provide compare results GTB and EQB to enable circuit 308-0, while lower order compare circuit 306-1 provides compare results GTC and EQC to enable circuit 308-1.

In a similar fashion to higher order compare circuit 304-0, in a very particular approach, lower order compare circuits (306-0 and 306-1) can receive multiple pre-decode signals and determine if one such pre-decode signal is active, or if multiple such pre-decode signals are active. In the very particular example of FIG. 3, lower order compare circuits (306-0 and 306-1) can receive two pre-decode signals. If one particular pre-decode signal is active and the other is not, one comparison result (GTB or GTC) may be activated. However, if both pre-decode signals are active, another comparison result (EQB or EQC) may be activated.

The operation of lower order compare circuits (306-0 and 306-1) may be affected by a higher order compare circuit 304-0. In particular, lower order compare circuits (306-0 and 306-1) may be enabled according to one comparison result from a higher order compare circuit 304-0. Further, a lower order compare circuit (306-0 and 306-1) result may be controlled by another comparison result from a higher order compare circuit 304-0. For example, in FIG. 3, lower order compare circuits (306-0 and 306-1) may be enabled when compare result EQA from higher order compare circuit 304-0 is active. Further, lower order compare circuit (306-0 and 306-1) may result in GTB and GTC being forced active when compare result GTA from higher order compare circuit 304-0 is active.

In FIG. 3, one example of a lower order compare circuit 306-0 is shown in detail. Such a lower order compare circuit 306-0 may include a third gate 310-2 that can generate an initial compare result GTB', and a fourth gate 310-3 that can generate another compare result EQB. A lower order compare circuit 306-0 may also include a combining gate 310-4, that can logically combine an initial compare result GTB' with a higher order compare result GTA, to thereby generate a compare result GTB. Of course, while FIG. 3 shows particular gate arrangements for lower order compare circuit 306-0, alternative logic may be employed to generate a same or similar result. Accordingly, the particular logic gate arrangement for lower order compare circuit 306-0 in FIG. 3 should not be construed as limiting the invention thereto.

In FIG. 3, lower order compare results (GTB and GTC) can also be conceptualized as a "greater than" address result. Such a "greater than" address result can indicate that an address corresponding to a group of decoder output signals is greater than a received address value. Thus, all such decoder outputs can be activated or deactivated. For example, if compare result GTB is active, decoder output signal group DEC0–DEC7 can be activated. Similarly, if compare result GTC is active, decoder output signal group DEC8–DEC15 can be activated.

Lower order compare results (EQB and EQC) can be conceptualized as "equal to" address results. Such "equal to" address results can indicate that one of the decoder output signals in a corresponding group has an address equal to a received address. Thus, groups within such a collection of decoder signals may be selectively activated according to lower order pre-decode signals (e.g., P0–P7).

The very particular example of FIG. 3 shows an enable circuit 308-0 that can include a first set of logic gates 310-5 and a second set of logic gates 310-6. A first set of logic gates 310-5 can logically combine each lowest order pre-decode signal P0–P7 with one lower order compare result EQB. In particular, if compare result EQB is active (high in this example), outputs of logic gates 310-5 can follow received pre-decode signal P0–P7 values. However, if compare result EQB is inactive (low in this example), outputs of logic gates 310-5 can be forced to predetermined values (e.g., all low).

A second set of logic gates 310-6 can logically combine each output from the first set of logic gates with another lower order compare result GTB. In particular, if lower order compare result GTB is inactive (low in this example), outputs of logic gates 310-6 can follow those of logic gates 310-5. However, if lower order compare result GTB is active (high in this example), outputs of logic gates 310-6 can be forced to predetermined values (e.g., all high).

Having described the general structure of a second embodiment, the operation of the second embodiment will now be described with reference to FIGS. 4A to 4C.

Figure 4A:
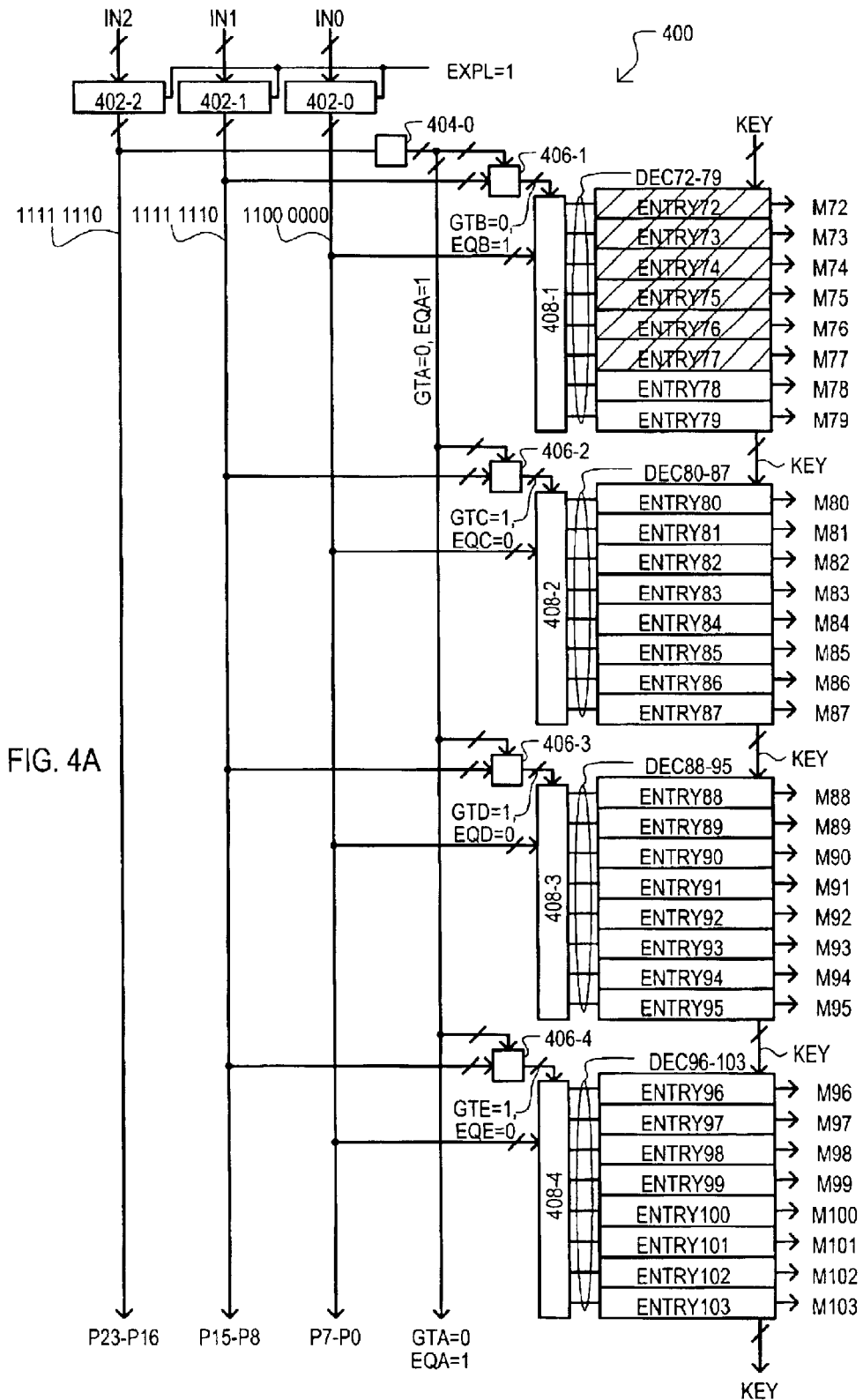
FIGS. 4A to 4C are block schematic diagrams showing the operation of a decoder circuit according to a second embodiment.
Figure 4B:
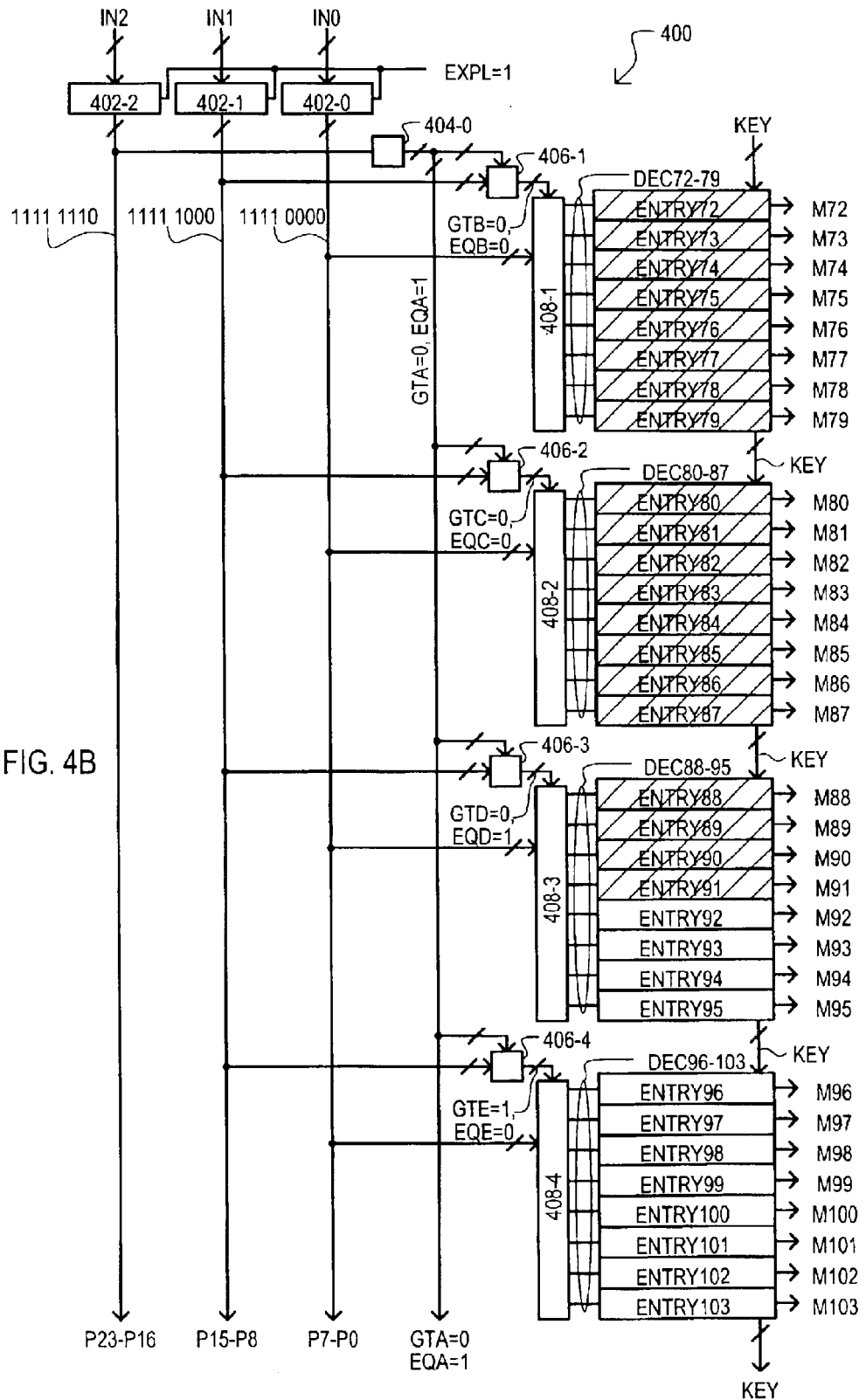
Figure 4C:
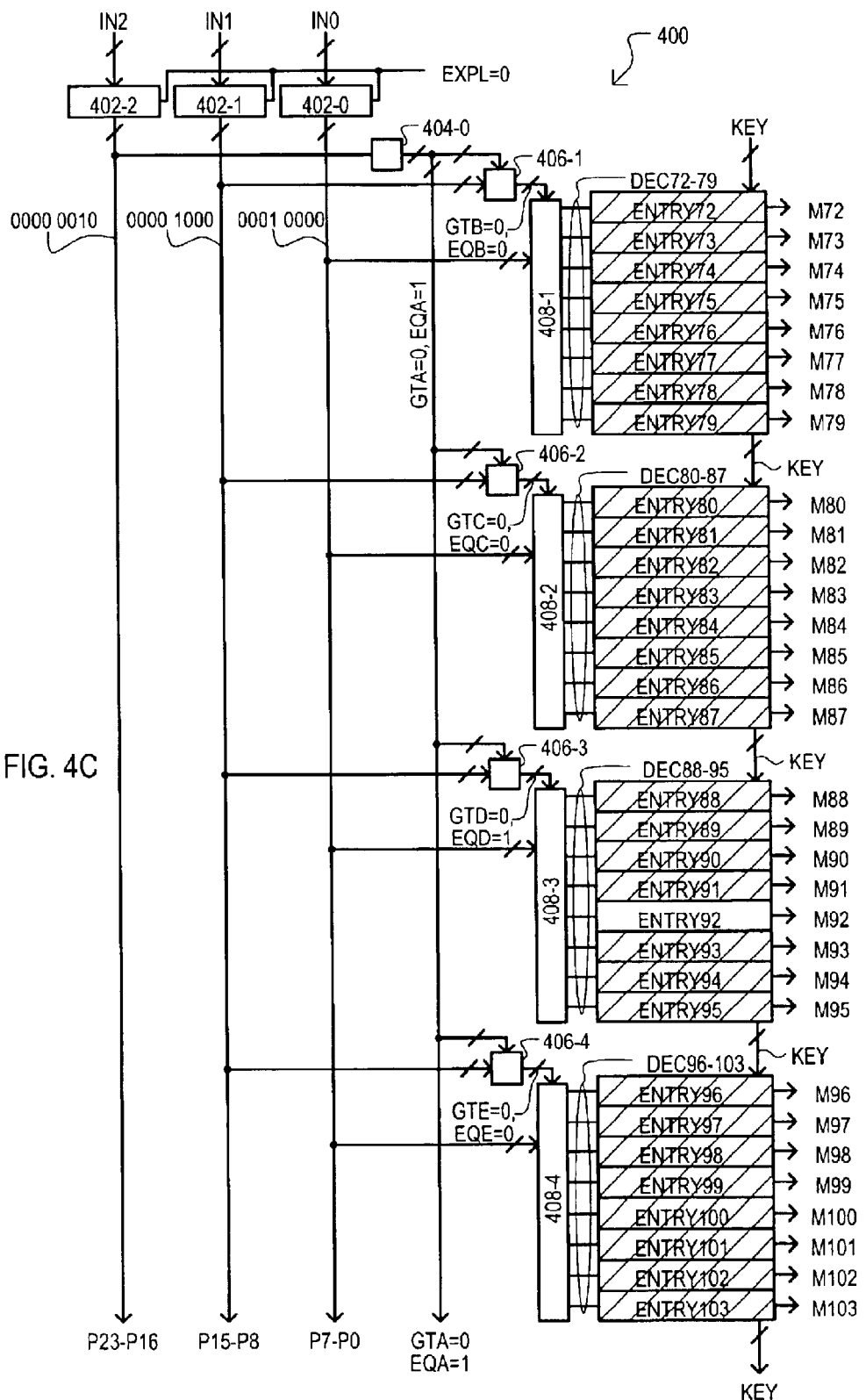

FIGS. 4A to 4C show examples of a decoder circuit having the same general arrangement of that shown in FIG. 3. Accordingly, like portions will be referred to by the same reference character but with the first digit being a "4" instead of a "3." Thus, FIGS. 4A to 4C show string decoders 402-0 to 402-2, higher order compare circuit 404-0, lower order compare circuits 406-1 to 406-4, and enable circuits 408-1 to 408-4. Also shown in FIGS. 4A to 4C are pre-decode signals P0 to P23, as well as decoder output signals DEC72 to DEC103.

Unlike FIG. 3, FIGS. 4A and 4B show a particular CAM application for a decoder circuit. Thus, decoder output signals DEC72 to DEC103 can be provided to CAM entries ENTRY72 to ENTRY103.

It is understood that in the example illustrated, in a search operation, CAM entries (ENTRY72 to ENTRY103) may each compare a stored data value to an applied search key value KEY. In response to such a comparison result, a CAM entry may generate a corresponding match indication (M72 to M103). Still further, in a search operation, a CAM entry may be enabled according to a corresponding decoder input signal DEC72 to DEC103. In contrast, in a read or write operation, a selected CAM entry (ENTRY72 to ENTRY103) may receive or output a data value. Such a CAM entry may be selected according to a corresponding decoder input signal DEC72 to DEC103.

In the examples of FIGS. 4A to 4C, it will be assumed that entries can be enabled when a corresponding decoder output is active and disabled when a corresponding decoder output is inactive. Further, in FIGS. 4A to 4C, a disabled entry may be represented by hatching.

FIGS. 4A to 4C illustrate a decoding of two combinations for input values IN0 to IN2 (which may be portions of a single CAM entry address). FIG. 4A shows result in which input value IN2 is string decoded to generate pre-decode signals P23 to P16 having the values "1111 1110," respectively (i.e., only P16 is inactive), input value IN1 is string decoded to generate pre-decode signals P15 to P8 having the values "1111 1110," respectively (i.e., of pre-decode signals P15 to P8, only P8 is inactive), and input value IN0 is string decoded to generate pre-decode signals P7 to P0 having the values "1100 0000", respectively (i.e., only P7 and P6 are inactive).

FIG. 4B shows a result in which input value IN2 is string decoded in the same fashion as FIG. 4A. However, in FIG. 4B, a different input value IN1 is string decoded to generate pre-decode signals P15 to P8 having the values "1111 1000," respectively (i.e., P10 to P8 are inactive), and a different input value IN0 is string decoded to generate pre-decode signals P7 to P0 having the values "1111 0000," respectively (i.e., P3 to P0 are inactive).

FIG. 4C shows a result in which input values IN2, IN1 and IN0 are the same as those of FIG. 4B. However, such values are "one-hot" decoded and not string decoded. Consequently, pre-decode signals P23 to P16 have the values "0000 0010," respectively (i.e., only P17 is active), pre-decode signals P15 to P8 have the values "0000 1000,"

respectively (i.e., only P11 is active), and pre-decode signals P7 to P0 have the values "0001 0000", respectively (i.e., only P4 is active).

The operation shown in FIG. 4A will now be described.

Higher order compare circuit 404-0 may receive pre-decode signals P17 and P16 and compare such values. Because P17 and P16 are not both active, a "greater than" result (e.g., GTA) can be inactive. However, because P17 is inactive and P16 (the signal of lesser significance) is active, an "equal to" result (e.g., EQA) can be active. Such higher order comparison results may be provided to lower order compare circuits (406-1 to 406-4). Because a higher order "equal to" compare result (EQA) is active, lower order compare circuits (406-1 to 406-4) can be enabled, thus providing lower order compare results according to lower order pre-decode signals P15 to P8.

Lower order compare circuit 406-1 can receive pre-decode signals P9 and P8. Because P9 and P8 are not both active, a "greater than" result (GTB) can be inactive. However, an "equal to" result (EQB) can be active. Consequently, activation of decoder outputs DEC79 to DEC72 can vary according to lowest order pre-decode signals P7–P0. In the example of FIG. 4A, pre-decode signals P7–P0 are 1100 0000, respectively. As a result, decoder outputs DEC79 to DEC72 are 1100 0000, respectively.

Thus, referring to FIG. 4A, in response to decoder outputs DEC79 to DEC72 of 1100 0000, respectively, entries ENTRY72 to ENTRY77 may be disabled, while entries ENTRY78 and ENTRY79 can be enabled.

Lower order compare circuit 406-2 can receive pre-decode signals P10 and P9. Because P10 and P9 are both active, a "greater than" result (GTC) can be active. Consequently, decoder outputs DEC80 to DEC87 can be forced to predetermined values (high in this example). Thus, referring to FIG. 4A, in response to decoder outputs DEC80 to DEC87 of 1111 1111, respectively, entries ENTRY80 to ENTRY 87 may all be enabled.

Lower order compare circuit 406-3 can receive pre-decode signals P11 and P10. Because both such signals are active, lower order compare circuit 406-3 can operate in the same general fashion as lower order compare circuit 406-2, resulting in decoder outputs DEC88 to DEC95 of 1111 1111, respectively. Thus, entries ENTRY88 to ENTRY95 may all be enabled.

Similarly, lower order compare circuit 406-4 can receive pre-decode signals P12 and P11, which are both active. Thus, decoder outputs DEC96 to DEC103 can be 1111 1111, enabling corresponding entries ENTRY96 to ENTRY103.

The operation shown in FIG. 4B will now be described.

Because pre-decode signals P23–P16 are the same as FIG. 4A, in FIG. 4B higher order compare circuit 404-0 can operate in the same fashion as FIG. 4A, enabling lower order compare circuits (406-1 to 406-4).

Lower order compare circuit 406-1 can receive pre-decode signals P9 and P8. Because P9 and P8 are both inactive, a "greater than" result (GTB) and an "equal to" result (EQB) can both be inactive. Consequently, activation of decoder outputs DEC79 to DEC72 can be disabled. As a result, decoder outputs DEC79 to DEC72 are 0000 0000, respectively. This can disable corresponding entries ENTRY79 to ENTRY72.

Similarly, lower order compare circuit 406-2 can receive pre-decode signals P10 and P9, which are both inactive. Thus, decoder outputs DEC87 to DEC80 can be 0000 0000, disabling corresponding entries ENTRY87 to ENTRY80.

Lower order compare circuit 406-3 can receive pre-decode signals P11 and P10. Because P11 and P10 are not both active, a "greater than" result (GTD) can be inactive. However, an "equal to" result (EQD) can be active. Consequently, activation of decoder outputs DEC95 to DEC88 can vary according to lowest order pre-decode signals P7–P0. In the example of FIG. 4B, pre-decode signals P7–P0 are 1111 0000, respectively. As a result, decoder outputs DEC88 to DEC95 are 1100 0000, respectively. Thus, entries ENTRY88 to ENTRY91 may be disabled, while entries ENTRY92 to ENTRY95 may be enabled.

Lower order compare circuit 406-4 can receive pre-decode signals P12 and P11. Because P12 and P11 are both active, a "greater than" result (GTE) can be active. Consequently, a decoder outputs DEC103 to DEC96 can be forced to predetermined values (high in this example). Thus, referring to FIG. 4B, entries ENTRY103 to ENTRY 96 may all be enabled.

In this way, string decoding may enable only a portion of the entries within a CAM device to thereby conduct a restricted search (e.g., a search beyond, or explore).

As noted above, while a decoder circuit according to the present invention may provide string decoding, such a circuit may also provide conventional decoding results.

A decoding operation that provides conventional decoding results will now be described with reference to FIG. 4C.

FIG. 4C is essentially the same as FIG. 4B, but a mode signal EXPL is "0" instead of "1." Such a mode signal may result in conventional decoding results. As but one example, conventional decoding may allow data to be read from or written to one CAM entry.

In FIG. 4C, input values IN0 to IN2 may be the same as those of FIG. 4B. However, because mode signal EXPL is low, string decoders 402-0 to 402-2 may provide "one-hot" decode outputs.

As in the previous examples, higher order compare circuit 404-0 may receive pre-decode signals P17 and P16 and compare such values. Because P17 and P16 are not both active, a "greater than" result (e.g., GTA) can be inactive. However, because P17 is inactive and P16 (the signal of lesser significance) is active, an "equal to" result (e.g., EQA) can be active. Such higher order comparison results may be provided to lower order compare circuits (406-1 to 406-4). Because a higher order "equal to" compare result (EQA) is active, lower order compare circuits (406-1 to 406-4) can be enabled, thus providing lower order compare results according to lower order pre-decode signals P15 to P8.

Lower order compare circuit 406-1 can receive pre-decode signals P9 and P8. Because P9 and P8 are both inactive, a "greater than" result (GTB) and an "equal to" result (EQB) can both be inactive. Consequently, activation of decoder outputs DEC79 to DEC72 can be disabled. As a result, decoder outputs DEC79 to DEC72 are 0000 0000, respectively. This can disable corresponding entries ENTRY79 to ENTRY72.

Similarly, lower order compare circuit 406-2 can receive pre-decode signals P10 and P9, which are both inactive. Thus, decoder outputs DEC87 to DEC80 can be 0000 0000, disabling corresponding entries ENTRY87 to ENTRY80.

Lower order compare circuit 406-3 can receive pre-decode signals P11 and P10. Because P11 and P10 are not both active, a "greater than" result (GTD) can be inactive. However, an "equal to" result (EQD) can be active. Consequently, activation of decoder outputs DEC95 to DEC88 can vary according to lowest order pre-decode signals P7–P0. In the example of FIG. 4C, pre-decode signals P7–P0 are 0001 0000, respectively. As a result, only decoder output DEC92 can be activated. Thus, entry ENTRY92 may be enabled while entries ENTRY88 to ENTRY91 and ENTRY 93 to ENTRY95 can be disabled.

Lower order compare circuit 406-4 can receive pre-decode signals P12 and P11. Because P12 and P11 are both inactive, a "greater than" result (GTE) and "equal to" result (EQE) can both be inactive. Consequently, decoder outputs DEC103 to DEC96 can be forced to inactive states. Thus, as shown in FIG. 4C, entries ENTRY103 to ENTRY 96 are all disabled.

In this way, in response to particular input value combinations, a single entry may be enabled. This can allow for conventional decoding results.

It is noted that it may also be desirable in an arrangement like that set forth in FIGS. 4A to 4C, to activate all decoder signals to enable a search of all CAM entries. It follows from the above description, that the application of input values that decode into all active pre-decode signals may give such a result. If string decoding like that of FIG. 2 is utilized, such input values may all be 0. That is, in an unrestricted search mode (e.g., all valid CAM entries active) a binary address of 000 000 000 can generate pre-decode signals of "1111 1111 1111 1111 1111 1111" thus providing a conventional CAM search function.

Having described various embodiments of decoder circuits that can include string decoders, various possible string decoder examples will now be described. It is understood that the below string decoders are but examples of various possible approaches to string decoding that would be understood by those skilled in the art. Accordingly, the below examples should not necessarily be construed as limiting the invention thereto.

Figure 5:
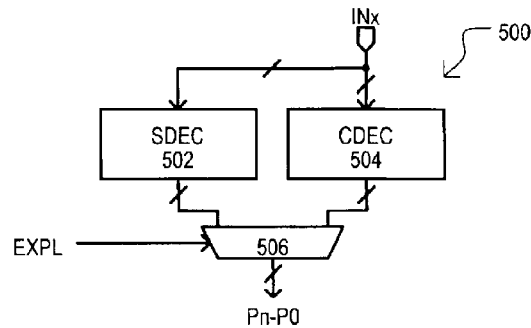
FIG. 5 is a block diagram of a string decoder according to one embodiment.

Referring now to FIG. 5, a block schematic diagram shows a string decoder, designated by the general reference character 500. A string decoder 500 may include a string decoder circuit 502, a one-hot decoder circuit 504, and a multiplexer (MUX) 506. A string decoder 500 may provide string type decoding as has been described above. A one-hot decoder circuit 504 may provide one-hot type decoding as also noted above. A MUX 506 may selectively output a result from a string decode circuit 504 or a one-hot decoder circuit 504 according to a mode signal EXPL.

Figure 6:
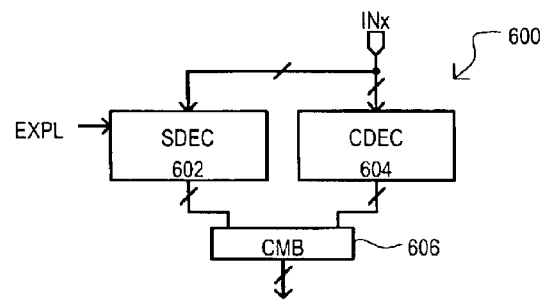
FIG. 6 is a block diagram of a string decoder according to another embodiment.

Referring now to FIG. 6, a second example of a string decoder is shown in a block schematic diagram and designated by the general reference character 600. A string decoder may include a mode controlled string decoder circuit 602, a conventional one-hot decoder circuit 604, and combining logic 606.

A mode controlled string decoder circuit 602 may provide string decode type outputs when a mode signal EXPL is active, and different type outputs when a mode signal is inactive. Such outputs can be combined within combining logic 606 with outputs from a one-hot decoder circuit 604 to generate desired pre-decode signals that vary according to mode.

Figure 7A:
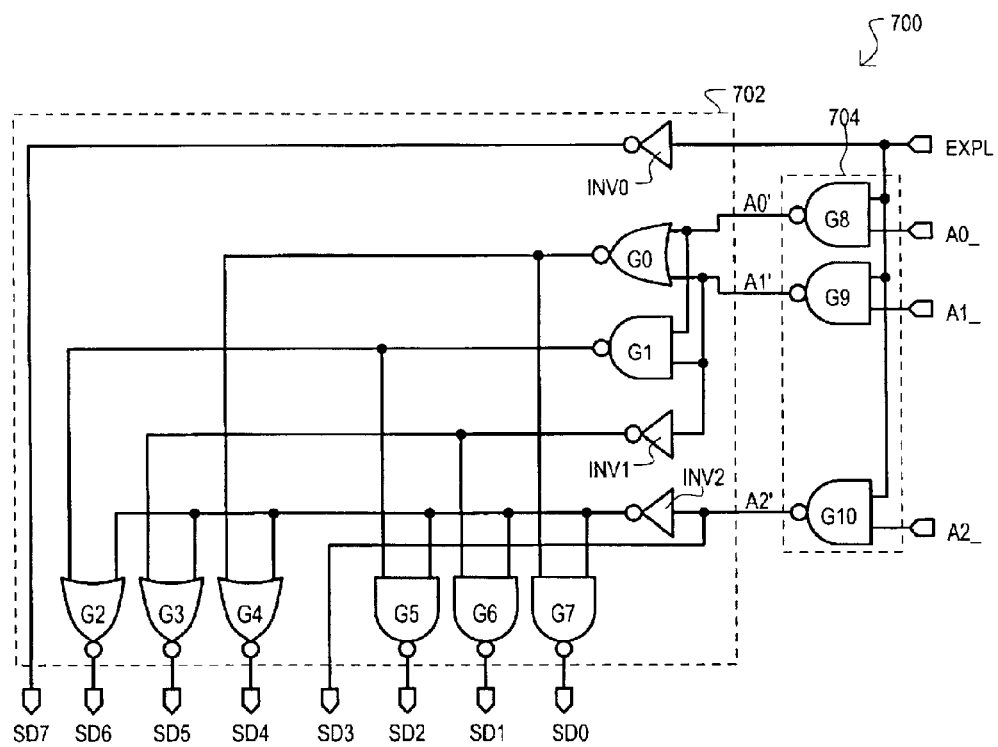
FIG. 7A is a schematic diagram of a mode controlled string decoder circuit according to an embodiment.

Referring now to FIG. 7A, one example of a mode controlled string decoder circuit is set forth in a block diagram and designated by the general reference character 700. A mode controlled string decoder circuit 700 may receive a number of inputs A0__ to A2__, and in response thereto provide string outputs SD7 to SD0.

The very particular example of FIG. 7A includes a decode section 702 and a mode set section 704. A mode set section 704 may receive inputs A0__ to A2__ and provide mode controlled values A0' to A2' to a decode section 702. Mode controlled values A0' to A2' may follow received inputs A0__ to A2__ in string decode mode (e.g., mode signal EXPL high). Alternatively, mode controlled inputs A0' to A2' may be set to predetermined values in a conventional decode mode (e.g., mode signal EXPL high).

In the particular example of FIG. 7A, a mode set section 704 may include NAND gates G8 to G10 that each have one input that receives a mode control signal. Gates G8, G9 and G10 may receive input values A0__, A1__ and A2__, respectively, as another input. The outputs of gates G8, G9 and G10 can provide mode controlled values A0' to A2'. Thus, when mode signal EXPL is low, mode controlled values A0' to A2' may all be forced high. However, when mode signal EXPL is high, mode controlled values A0' to A2' may be the inverse of received inputs A0__ to A2__, respectively.

Decode section 702 may provide string outputs SD7 to SD0. In the very particular example of FIG. 7A, a decode section 702 may include an inverter INV0 that can invert a mode signal EXPL to generate string output SD7. A NOR gate G0 may receive mode controlled values A0' and A1' as inputs. A NAND gate G1 may also receive mode controlled values A0' and A1' as inputs. An inverter INV1 can invert mode controlled value A1', while an inverter INV2 can invert mode controlled value A2'.

Decode section 702 may also include a number of gate for providing string outputs. In particular, decode section 702 may include a NOR gate G2 having one input connected to the output of NAND gate G1 and another input connected to the output of inverter INV2. The output of NOR gate G2 can be string output SD6. Two more NOR gates can provide string outputs SD5 and SD4. In particular, a NOR gate G3 can have one input connected to the output of inverter INV1 and another input connected to the output of inverter INV2. The output of NOR gate G3 can be string decode output SD5. A NOR gate G4 can have one input connected to the output of NOR gate G0 and another input connected to the output of inverter INV2. The output of NOR gate G4 can be string decode output SD4.

In the very particular decode section of FIG. 7A, a mode controlled value A2' can be provided as string output SD3. Further, three NAND gates G5–G7 can provide string outputs SD2 to SD0. In particular, NAND gates G5–G7 may all have one input connected to the output of inverter INV2. Further, NAND gate G5 may have another input connected to the output of NAND gate G1 and provide string output SD2, NAND gate G6 may have another input connected to the output of inverter INV1 and provide string output SD1, and NAND gate G7 may have another input connected to the output of NOR gate G0 and provide string output SD0.

Figures 7B, 8A:
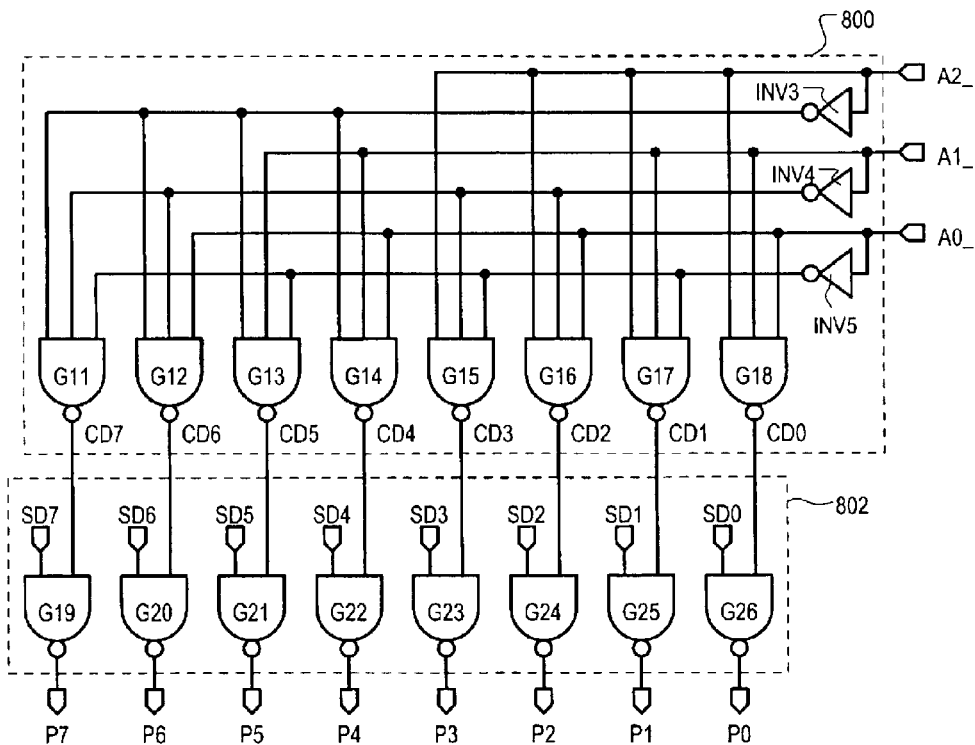
FIG. 7B is a truth table showing the operation of the circuit of FIG. 7A.
FIG. 8A is a schematic diagram of a one-hot decoder circuit and combining logic according to an embodiment.

FIG. 7B is a truth table showing the operation of the particular mode controlled string decoder circuit 700 of FIG. 7A.

Referring now to FIG. 8A, one example of a one-hot decoder circuit is set forth in a schematic diagram and designated by the general reference character 800. A one-hot decoder circuit 800 may receive a number of inputs A0__ to A2__, and in response thereto provide one-hot outputs CD7 to CD0.

In the very particular example of FIG. 8A, a one-hot decoder 800 may include inverters INV3 to INV5 for generating inverses of the various inputs A0__ to A2__. Logic gates G11 to G18 can logically combine different combinations of inputs A0__ to A2__ (and their inverses) to provide one-hot outputs CD7 to CD0.

Figures 8B, 9:
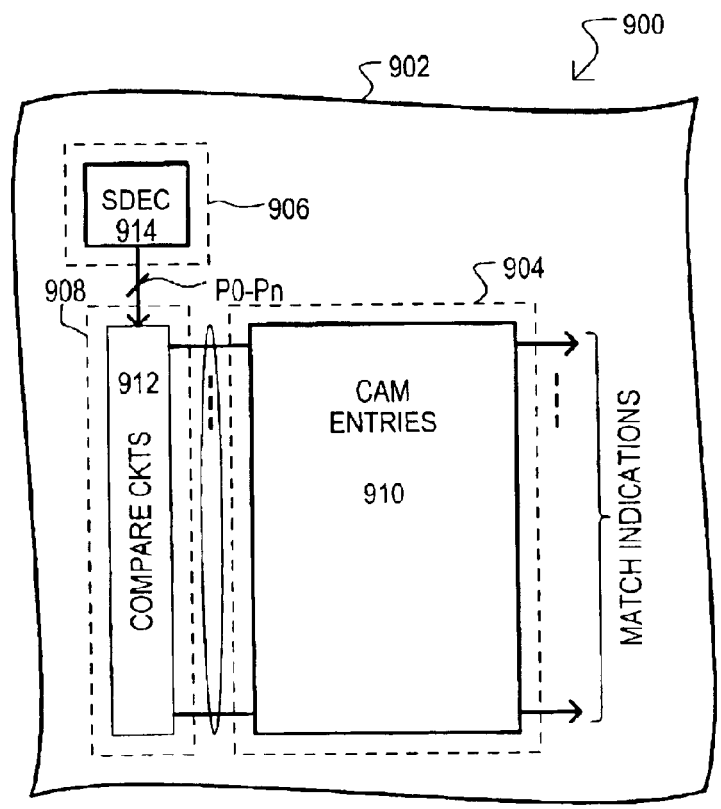
FIG. 8B is a truth table showing the operation of the one-hot decoder circuit of FIG. 8A.
FIG. 9 is a plan view of a content addressable memory device according to one embodiment.

FIG. 8B is a truth table showing the operation of the particular one-hot decoder circuit 800 of FIG. 8A.

FIG. 8A also includes combining logic 802 that may combine outputs from one-hot decoder circuit 800 with string outputs from a string decoder, like that shown in FIG. 7A, to generate pre-decode output signals P0–P7. In the very particular example of FIG. 8A, combining logic 802 may include a number of NAND gates G19 to G26. NAND gate G19 may receive a one-hot output CD7 and a string output SD7. In a similar fashion, NAND gates G20 to G26 may receive one-hot outputs CD6 to CD0, respectively, and string outputs SD6 to SD0, respectively. NAND gates G19 to G26 may provide pre-decode signals P0 to P7 as outputs.

It follows from FIGS. 7B and 8B, that resulting pre-decode signals P0–P7 may the same response shown in FIG. 2.

Of course one skilled in the art could arrive at alternate logic implementations for string decoder circuits, one-hot decoder circuits, and/or combining logic. Further, the term logic gate is not intended to exclude logic based on enabling and disabling passgates, or other such logic approaches.

Referring now to FIG. 9, a semiconductor device according to an embodiment is set forth in plan view and designated by the general reference character 900. A semiconductor device 900 may be formed in a semiconductor substrate 902 and include a first area 904, a second area 908, and a third area 906. A first area may include CAM entries 910. A second area may include compare circuits 912, like first and/or second compare circuits shown as 104 in FIG. 1, and/or 304-0, 306-0 and 306-1 of FIG. 3, and/or 404-0 and 406-1 to 406-4 in FIGS. 4A–4C. A third area 906 may include string decoders 914, like those shown as 102-0 and 102-1 of FIG. 1, and/or 302-0 to 302-2 in FIG. 3, and/or 402-0 to 402-2 in FIGS. 4A to 4C.

In an arrangement like that shown in FIG. 9, string decoder circuitry may be situated outside of a second area 908 adjacent to CAM entries 910. Such a second area 906 may be a more critical area in the layout of a semiconductor device, in that reducing such an area may lead to greater freedom in layout.

In this way pre-decoder circuitry may be situated more remote from CAM entries than other decoder circuitry.

While the embodiments set forth herein have been described in detail, it should be understood that the present invention could be subject to various changes, substitutions, and alterations without departing from the spirit and scope of the invention. Accordingly, the present invention is intended to be limited only as defined by the appended claims.

What is claimed is:

1. A decoder circuit, comprising:
a first string decoder that activates one of a plurality of first pre-decode signal in response to first input data values in a first mode, and activates a different plurality of the first pre-decode signals in response to each different first input data value in a second mode.

2. The decoder circuit of claim 1, further including:
a first compare circuit that compares at least two of the first pre-decode signals to generate a first comparison result.

3. The decoder circuit of claim 2, wherein:
the first pre-decode signals have an order with respect to one another; and
the first compare circuit generates one first comparison result when a lower order first pre-decode signal is active and a higher order first pre-decode signal is inactive, and generates another first comparison result when the lower order first pre-decode signal and higher order first pre-decode signal are both active.

4. The decoder circuit of claim 2, further including:
an enable circuit that generates decoder output signals according to second pre-decode signals in response to the one first comparison result from the first comparator, and generates predetermined decoder output signals in response to the other first comparison result from the first comparator.

5. The decoder circuit of claim 4, wherein:
the enable circuit includes a first set of gates that are enabled in response to the one first comparison result.

6. The decoder circuit of claim 5, wherein:
the enable circuit includes a second set of gates having inputs coupled to the outputs of the first set of gates, the second set of gates being enabled in response to the other first comparison result.

7. The decoder circuit of claim 2, further including:
a second string decoder that activates a different second pre-decode signal in response to different second input data values in a first mode, and activates a different plurality of the second pre-decode signals in response to each different second data value in a second mode; and
a second compare circuit that compares at least two of the second pre-decode signals to generate a second comparison result.

8. The decoder circuit of claim 7, wherein:
the second comparison result is coupled to the first compare circuit.

9. The decoder circuit of claim 7, wherein:
the second compare circuit logically combines the first comparison result with the second comparison result.

10. The decoder circuit of claim 1, comprising:
a plurality of first compare circuits that each compare at least two of the first pre-decode signals to generate first comparison results that each enable a content addressable memory (CAM) entry group; and
a plurality of second compare circuits that each compare at least two second pre-decode signals to generate second comparison results that enable entries within a same CAM entry group in the second mode.

11. The decoder circuit of claim 2, further including:
a plurality of first compare circuits formed in a second area of the substrate adjacent to a first area the includes a plurality of CAM entries; and
the first string decoder being formed in a third area of the substrate, different than the second area.

12. A method of activating decoder signals in a content addressable memory (CAM) device, comprising the steps of:
in a first mode, activating one of a plurality of first pre-decode signals in response to first input values; and
in a second mode, activating a different number of the first pre-decode signals in response to each different first input value.

13. The method of claim 12, wherein:
the first pre-decode signals have an order with respect to one another; and
activating a different number of the first pre-decode signals includes activating a sequential number of the first pre-decode signals according to the order.

14. The method of claim 12, wherein:

the first mode includes accessing a single CAM entry; and the second mode includes searching a predetermined number of CAM entries according to at least the first input values.

15. The method of claim 12, further including:

in the second mode, activating a different number of second pre-decode signals in response to each different second input value.

16. The method of claim 15, further including:

in the first mode, comparing the second pre-decode signals to enable one of a plurality of decoder output signal groups in response to different second input values; and in the second mode, comparing the second pre-decode signals to enable a different number of the output signal groups in response to different second input values.

17. The method of claim 16, further including:

in the first and second modes, activating decoder output signals from one of the output signal groups according to the first pre-decode signals.

18. The method of claim 12, wherein:

the first pre-decode signals have a significance with respect to one another; and in the second mode, in response to a particular first input value activating all first pre-decode signals having greater significance than the one first pre-decode signal activated in response to the same first input value in the first mode.

19. An address decoder circuit, comprising:

at least one circuit having at least two modes of operation, a first mode producing a single active output signal for each possible input state combination, and a second mode producing multiple active output signals for a majority of possible input state combination.

20. The address decoder of claim 19, wherein:

the multiple active output signals in the second mode are consecutive and range from the lowest order output signal to the same output signal as the single active signal in the first mode.

* * * * *